(12) United States Patent
Chen (10) Patent No.: US 10,396,142 B2
(45) Date of Patent: Aug. 27, 2019

(54) ARRAY SUBSTRATE AND AMOLED DISPLAY DEVICE

(71) Applicant: Wuhan China Star Optoelectronics Technology Co., Ltd., Wuhan, Hubei (CN)

(72) Inventor: Caiqin Chen, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 120 days.

(21) Appl. No.: 15/526,322

(22) PCT Filed: Mar. 13, 2017

(86) PCT No.: PCT/CN2017/076471
§ 371 (c)(1),
(2) Date: May 11, 2017

(87) PCT Pub. No.: WO2018/152879
PCT Pub. Date: Aug. 30, 2018

(65) Prior Publication Data
US 2018/0294327 A1    Oct. 11, 2018

(51) Int. Cl.
*H01L 27/32* (2006.01)
*H01L 27/02* (2006.01)
*H01L 27/12* (2006.01)

(52) U.S. Cl.
CPC ...... *H01L 27/3276* (2013.01); *H01L 27/0288* (2013.01); *H01L 27/124* (2013.01)

(58) Field of Classification Search
None
See application file for complete search history.

(56) References Cited

U.S. PATENT DOCUMENTS

2010/0007837 A1* 1/2010 Ham ................. G02F 1/134309
                                                349/139
2016/0104757 A1* 4/2016 Kim ..................... H01L 27/3276
                                                257/40

FOREIGN PATENT DOCUMENTS

CN    101625493 A    1/2010
CN    103927977 A    7/2014

* cited by examiner

*Primary Examiner* — Shaun M Campbell
(74) *Attorney, Agent, or Firm* — Andrew C. Cheng (57) ABSTRACT

This disclosure discloses an array substrate comprising: a substrate; a driver chip, located on the substrate; a plurality of data lines, arranged in turn on the substrate, extended longitudinally and electrically connected to the driver chip; a plurality of high level lines; a metal block, located on the substrate and electrically connected to the high level lines, so that the high level lines at the same high level; wherein the data lines are electrically connected to driver chip through the area which the metal block is located in, and an insulating layer exists between the metal block and the data lines, a hollow area located in the metal block overlaps the data lines to reduce parasitic capacitance formed by the metal block and the data lines. This disclosure also discloses an AMOLED display device. Impact of resistor-capacitor delay and damage to components can be reduced by using this disclosure.

14 Claims, 6 Drawing Sheets

ARRAY SUBSTRATE AND AMOLED DISPLAY DEVICE

CROSS REFERENCE TO RELATED APPLICATION

This disclosure requires the priority right of the application of the disclosure filed as "ARRAY SUBSTRATE AND AMOLED DISPLAY DEVICE" submitted on Feb. 22, 2017, application No. 201710097173.3, the contents of the above prior application is incorporated herein by reference.

FIELD OF THE INVENTION

This disclosure belongs to the field of display technology, in particular, to an array substrate and AMOLED display device.

BACKGROUND OF THE INVENTION

Organic light emitting diode (OLED) display device has many advantages such as self-luminous, low driving voltage, high luminous efficiency, short response time, high clarity and contrast, near 180° viewing angle, wide range of working temperature, and applicability of flexible display and large scale full color display. The OLED is considered as the most potential display device.

According to the driving mode, the OLED display device can be classified into two types: a passive matrix OLED (PMOLED) display device and an active matrix OLED (Active Matrix OLED, AMOLED) display device, namely a direct addressing and a thin film transistor (TFT) matrix addressing. The AMOLED display device has pixels arranged in an array, the display is an active type, high luminous efficacy, and commonly used as large-size high-definition display device.

Figure 1:
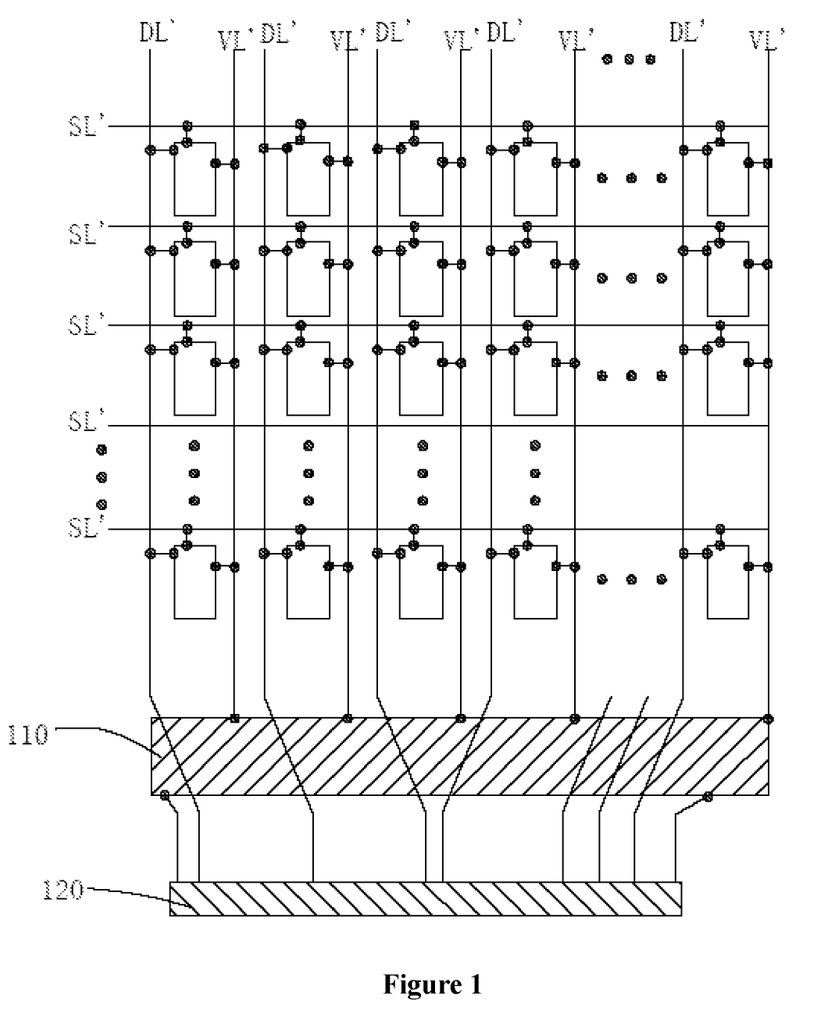
FIG. 1 is a schematic view of an array substrate according to the prior art.

AMOLED display device includes an array substrate, the array substrate includes a substrate, referring to FIG. 1, on the substrate is provided with a plurality of scan lines SL', a plurality of data lines DL', and a plurality of high level line VL', the scan lines SL' extend laterally from the left side to the right side of the substrate, the data lines DL' extend longitudinally from the upper side to the lower side of the substrate, the high level lines VL' also extend longitudinally from the upper side to the lower side of the substrate, the lower terminals of the high level lines VL' are electrically connected to the metal block 110, the metal block 110 is electrically connected to the driver chip 120 on the lower side of the substrate, the data lines DL' are also electrically connected to the driver chip 120 through the metal block 110, the data lines DL' and the metal block are piled up layer by layer, for example, the metal block 110 is located above the data lines DL' or the metal block 110 is located under the data lines DL', the metal block 110 the data lines DL' are on the different levels of the substrate and are separated by an insulating layer.

In the process of using the AMOLED display device, the inventors of this disclosure has found that, since the data lines DL' are electrically connected to the driver circuit through the metal block 110, the metal block 110, the insulating layer exists between the metal block 110 and the data line DL', thereby forming a parasitic capacitor, the parasitic capacitor generates resistor-capacitor delay (RC delay) influence to signal transfer of the data line DL'; Moreover, since the surface area of the metal block is larger, an amount of static electricity is accumulated during the manufacturing process of the array substrate, the electrostatic discharge (ESD) would cause component damage of the AMOLED display device.

SUMMARY OF THE INVENTION

The technical problems of embodiments of this disclosure to be solved is to provide an array substrate and an AMOLED display device, which can reduce resistance-capacitance delay influence and reduce the electrostatic discharge damage to the components.

To solve the above problems, a first aspect of this disclosure provides an array substrate, comprising:

a substrate;

a driver chip, located on the substrate;

a plurality of data lines, which are arranged in turn on the substrate, and extending longitudinally and connected electrically to the driver chip;

a plurality of high level lines, arranged in turn on the substrate, and extending longitudinally on the substrate;

a metal block, located on the substrate and electrically connected to the high level lines, so that the high level lines are at the same high level; wherein the data lines are electrically connected to driver chip through the area which the metal block is located in, and a insulating layer exists between the metal block and the data lines, a hollow area located in the metal block overlapping the data lines to reduce parasitic capacitance formed by the metal block and the data lines.

The hollowed area is derating slits.

The number of the derating slits is multiple, the derating slits comprises first type derating slits, each one of the first type derating slits corresponds to one of the data lines respectively; or the derating slits includes second type derating slits, at least two of the second type derating slits correspond to a same data line respectively; or the derating slits includes first and second type derating slits, the derating slits comprises first type derating slits, each one of the first type derating slits corresponds to one of the data lines respectively, at least two of the second type derating slits correspond to the same data line.

The derating slit width is greater than or equal to width of the corresponding data line, the derating slit covers the corresponding data line.

An de-electrostatic slit is provided on the metal block, the de-electrostatic slit is located at the outside of the area of the data lines.

The hollowed area is an opening, the opening crosses at least two of the data lines.

A ratio range of surface area of the hollowed area and surface area of the metal block not provided with a hollowed area is 3/4-1/6.

The data lines extend from the upper side of the substrate to the lower side of the substrate, the data lines comprises a vertical portion, a sector portion and a connecting portion, and the metal block overlaps the sector portion of the data lines.

The array substrate further includes a plurality of scan lines, the scan lines extends in a lateral direction, and the scan lines and the data lines cross each other to define a plurality of pixel units, in each of the pixel units is provide with a first thin film transistor, a second thin film transistor, an organic light emitting diode and the capacitor, the first thin film transistor is located in intersection of the scan lines and the data lines, a gate electrode of the first thin film transistor is electrically connected to the scan line, an input terminal of the first thin film transistor is electrically connected to of the data line, an output terminal of the first thin film transistor is electrically connected to a gate electrode of the second thin film transistor and one end of the capacitor, an input terminal of the second thin film transistor and the other end of the capacitor are electrically connected to the high level line, the output terminal of the second thin film transistor is electrically connected to an anode or a cathode of the organic light emitting diode.

The second aspect of embodiments of this disclosure provides an AMOLED display device, including the above-mentioned array substrate.

Carrying out the embodiments of this disclosure has the following beneficial effects:

Since the data lines are electrically connected to driver chip through the area which the metal block is located in, and a insulating layer exists between the metal block and the data lines, a hollow area located in the metal block overlapping the data lines to reduce parasitic capacitance formed by the metal block and the data lines. Thus, by providing the hollowed area, the overlapping area of the data lines and the metal block is reduced, thereby the parasitic capacitance can be reduced, so that this embodiment relative to the prior art can reduce the impact to the signal transfer of data online; moreover, since the region has a hollowed area provided on the metal block, the surface area of the metal block has been reduced, the static electricity is not easy to be accumulated during the manufacturing process, so that the component damage of the AMOLED display device caused by the electrostatic discharge on the metal block can be reduced.

BRIEF DESCRIPTION OF THE DRAWINGS

The following sections offer a clear, complete description of this disclosure in combination with the embodiments and accompanying drawings. Obviously, the embodiments described herein are only a part of, but not all the embodiments of this disclosure. In view of the embodiments described herein, any other embodiment obtained by the person skilled in the field without offering creative effort is included in a scope claimed by this disclosure.

DETAILED DESCRIPTION OF THE PREFERRED EMBODIMENTS

The following sections offer a clear, complete description of the present disclosure in combination with the embodiments and accompanying drawings. Obviously, the embodiments described herein are only a part of, but not all the embodiments of the present disclosure. In view of the embodiments described herein, any other embodiment obtained by those of ordinary skill in the art skilled in this art without offering creative effort is included in a scope claimed by the present disclosure.

In this specification, claims, and drawings, the terms "comprises," "comprising," "includes," "including," "has," "having" or any other variation thereof are intended to cover a non-exclusive inclusion. For example, a process, method, system, product or apparatus that comprises a list of steps or elements is not necessarily limited to only those elements but may optionally include other steps or elements not listed or inherent to such process, method, product, or apparatus. In addition, the terms "first", "second" and "third" are used to distinguish between different objects, rather than to describe a specific order.

First Embodiment

Figure 2:
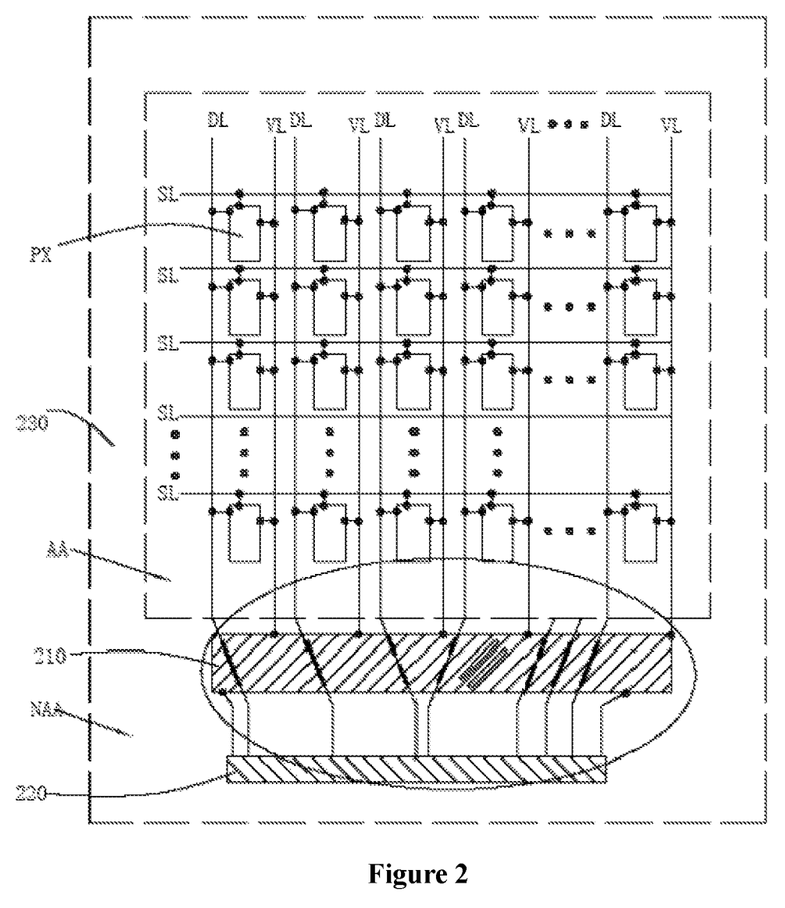
FIG. 2 is a schematic view of an array substrate of a first embodiment of this disclosure.
Figure 3:
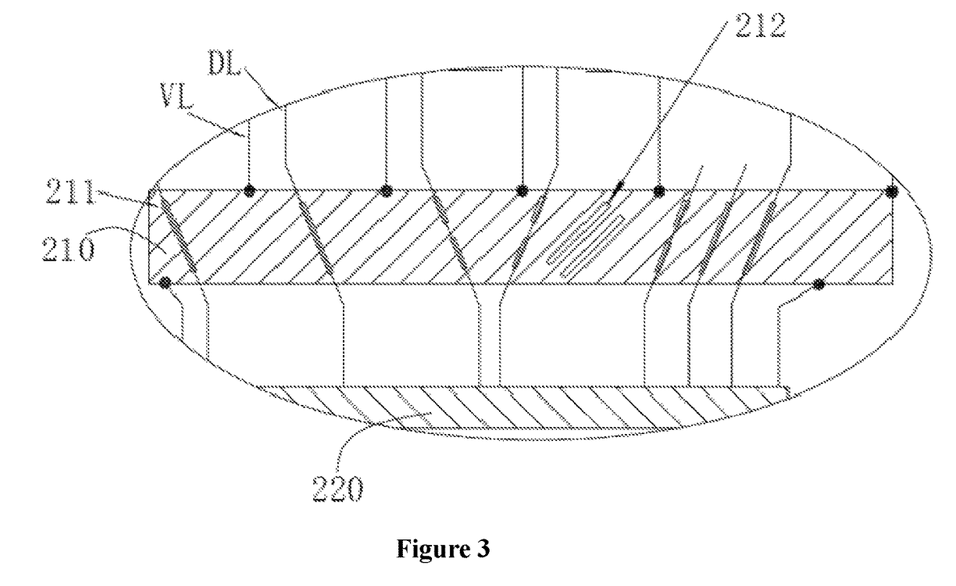
FIG. 3 is an enlarged view of an elliptical area in FIG. 2.
Figure 4:
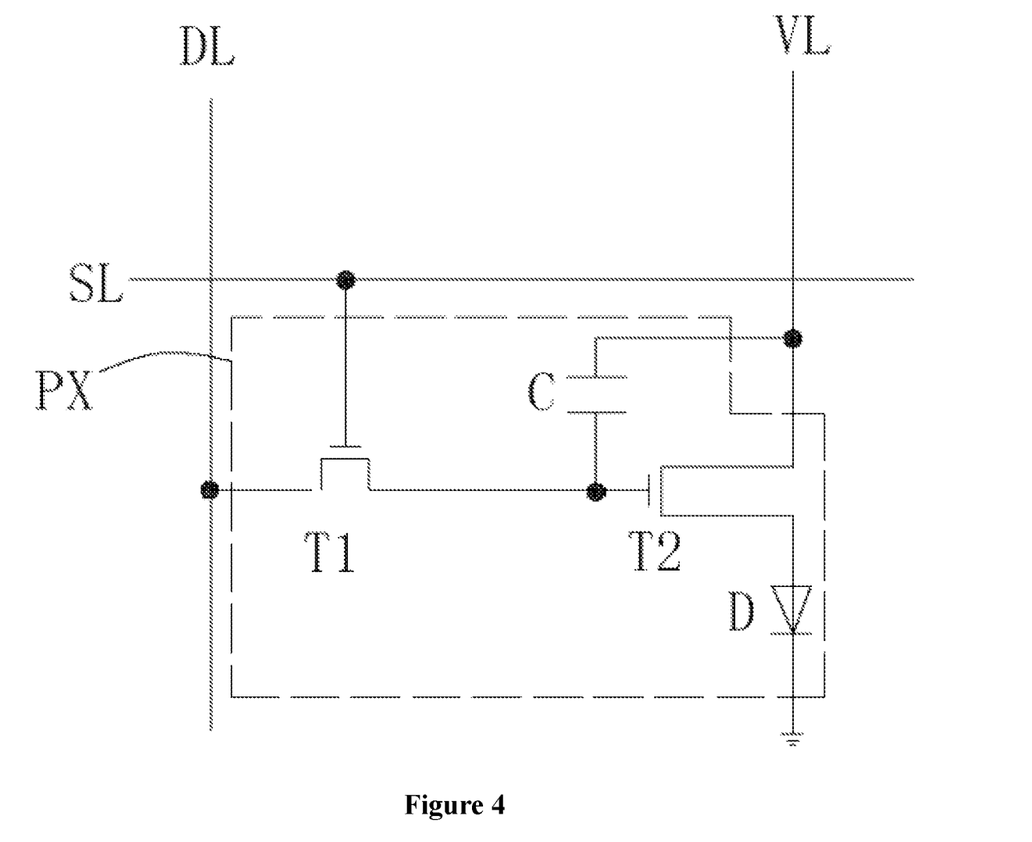
FIG. 4 is a schematic view of a pixel unit of the first embodiment of this disclosure.

Referring to FIG. 2 to FIG. 4, the embodiment of this disclosure provides an active matrix organic light emitting diode (Active Matrix OLED, AMOLED) display device, including an array substrate and a thin film encapsulation layer, the thin film encapsulation layer is located above the array substrate. The array substrate includes a substrate 230, a driver chip 220, a plurality of data lines DL, a plurality of level lines VL, and a metal block 210.

The substrate 230 may be a rigid substrate such as a glass substrate, or a flexible substrate such as a polyimide plastic substrate. The driver chip 220 is located on the substrate 230. In this embodiment, the driver chip 220 is located on the lower side of the substrate 230. A plurality of data lines DL are arranged in turn on the substrate 230, and are extended longitudinally to be connected electrically to the driver chip 220. In this embodiment, the data lines DL are extended longitudinally from the upper side of the substrate 230 to be connected electrically to the driver chip 220, namely are extended from the upper side of the substrate 230 to the lower side of the substrate 230, the data lines DL includes a vertical portion, a sector portion and a connecting portion, the vertical portion of the data lines DL is disposed vertically, and the sector portion of the data lines DL is inclined, the inclination angle of the sector portion is greater than or equal to 30° and less than 90°, e.g. 30°, 40°, 45°, 50°, 60°, 70°, 75°, 80°, 85°. The connecting portion of the data line DL is disposed vertically, the sector portion is located between the vertical portion and the connecting portion, the lower end of the connecting portion is electrically connected to the driver chip 220. The high level lines VL are also arranged in turn on the substrate 230, and are extended longitudinally on the substrate 230. In this embodiment, the high level lines VL are extended longitudinally from the upper side of the substrate 230 to the lower side. The high level lines VL and the data lines DL are on different layers of the substrate 230, a first insulation layer is disposed between the high level lines VL and the data lines DL. The metal block 210 is located on the substrate 230 and is connected electrically to the high level lines VL, to make the high lines VL in the same high level, in this embodiment, the metal block 210 is electrically connected to the lower end of the high level lines VL. The number of the metal block 210 in the present embodiment is one, namely the metal block 210 is a large metal block. However, this disclosure is not limited, in other embodiments of this disclosure, the number of the metal block may be multiple, and adjacent surface metal blocks are electrically connected to each other. In this embodiment, the metal block 210 and the high level line VL are located in the same metal layer of the substrate 230, in other embodiments of this disclosure, the metal block and the high level lines may also be located on different metal layers.

In this embodiment, the metal block 210 is located on the top side of the driver chip 220, the data lines DL are electrically connected to the driver chip 220 through the metal block 210, namely the metal block 210 is either located above the data lines DL or below the data lines DL, a second insulating layer exists between the metal block 210 and the data lines DL. In this embodiment, the first insulating layer and the second insulating layer are the same insulating layer, e.g. SiOx, but without limitation, in other embodiments of this disclosure, the first insulating layer and the second insulating layers can also be different insulating layers on the substrate. Thus, a parasitic capacitance is formed by the data lines DL and the overlapping region of the metal block 210, in specific, the parasitic capacitor generates resistor-capacitor delay (RC delay) influence to the signal transfer of the data line DL. In order to reducing the influence, the parasitic capacitance is reduced to decrease the influence of the RC delay. Specifically, a hollowed area is disposed in the place which the metal block 210 overlaps the data lines DL to reduce the parasitic capacitance formed by the metal block 201 and the data lines DL, the hollowed area is the corresponding portion of metal, such as a through hole, or a through hole filled with a non-metallic material, thereby the parasitic capacitance is not formed by the hollowed area and the data lines DL.

Since the data lines DL is electrically connected to the driver chip 220 through the metal block 210, and a insulating layer exists between the metal block 210 and the data lines DL, a hollowed area is disposed in the place which the metal block 210 overlaps the data lines DL to reduce the parasitic capacitance formed by the metal block 201 and the data lines DL. Thus, by disposing a hollowed area, the overlapping area of the data lines DL and the metal block is reduced whereby the parasitic capacitance has been reduced, so that the influence of signal transfer to the data lines DL can be reduced in this embodiment relative to the prior art; in addition, since the metal block 210 is provided with a hollowed area, the surface area of the metal block 210 has been reduced, the static electricity is not easy to accumulated during the manufacturing process, so that the probability of component damage of AMOLED display device caused by the electrostatic discharge on the surface metal block 210 has been reduced.

Referring to FIGS. 2 and 3, in this embodiment, the hollowed area is a derating slit 211, the derating slit 211 is a narrow slit, such as a long strip, the length of derating slit 211 is greater than its width, for example, a length of 60-200 µm, such as 60 µm, 70 µm, 80 µm, 90 µm, 95 µm, 100 µm, 105 µm, 110 µm, 120 µm, 150 µm, 200 µm, and the width of the derating slit 211 is several µm to tens of µm.

In this embodiment, the number of the derating slits 211 is multiple, such as three, four, six, ten, twenty, thirty. As shown in FIG. 3, the number of the derating slits 211 is 10, the derating slits 211 include first type derating slits and second type derating slits 211, each one of the first type of the derating slit 211 is disposed corresponding to one of the data lines DL, referring to FIG. 3, at the left and right sides close to the edge of the metal block 210, each side is provided with two derating slits 211, each one of the four derating slits 211 is disposed corresponding to one the data lines DL; at least two of the second type of derating slits 211 are disposed corresponding to one of the data lines DL, see FIG. 3 the six derating slit 211 near the center of the metal block 210, each two of the six derating slits 211 correspond to one of data lines DL, of course in other embodiments of this disclosure, the number of the second derating slit disposed corresponding to one data line can also be the number such as 3, 4, 5. Here, the derating slits 211 corresponding to the data lines DL means that the derating slit 211 corresponding to the data line DL is parallel or nearly parallel, that is to say, the derating slits 211 are disposed directly above or below the data lines DL, thereby the parasitic capacitance is not formed at the derating slit 211, or the parasitic capacitance can be greatly reduced at the derating slit 211. In addition, in other embodiments of this disclosure, the derating slits can also be all the first type derating slits, or the derating slits are all the second type derating slits. In addition, in other embodiments of this disclosure, the derating slits can also be disposed without corresponding to the data lines, namely the derating slits can also be unparallel to the corresponding data lines, for example, each one of the derating slits may span over several data lines, such derating slit design can also achieve the effect of reducing the parasitic capacitance, but the effect is not better than the one of this embodiment. In addition, in other embodiments of this disclosure, the number of the derating slit can also be one. A derating slits may be disposed corresponding to a data line, or may not be disposed corresponding to a data line.

In this embodiment, in order to maximize the reduction of parasitic capacitance, the derating slit 211 is disposed corresponding to the data line DL, the width of the derating slit 211 is greater than or equal to the width of the corresponding data line DL, it is better to be greater than width of the corresponding data line DL, the derating slit 211 covers the corresponding data line, namely the projection of the derating slit 211 on the substrate 230 covers the projection of the corresponding data line DL on the substrate 230, and the width of the derating slit 211 depends on the widths of the data line DL and the adjacent data line DL. In this embodiment, the width range of the derating slit 211 may be 2-20 µm, e.g. 2 µm, 5 µm, 8 µm, 10 µm, 20 µm. In addition, in other embodiments of this disclosure, the width of the derating slit may be less than the corresponding width of the data line.

In this embodiment, the metal block 210 is also provided with de-electrostatic slits 212, the de-electrostatic slits 212 are located at the outside of the area of the data lines DL, that is, the de-electrostatic slits 212 does not overlap the data lines DL, for example, the de-electrostatic slits 212 are located in the region between two adjacent data lines, so that such de-electrostatic slits 212 does not reduce the parasitic capacitance, but due to the presence of de-electrostatic slits 212, the surface area of the metal block 210 can be reduced, so that the metal block 210 is not easy to accumulate static electricity during the manufacturing process In this embodiment, the array substrate includes a display region AA and a non-display region NAA, the sector portion and the connecting portion of the data lines DL, the driver chip 220, the metal block 210 are located in the non-display region NAA, the vertical portion of the data lines DL, a part of the high level lines VL are located in the display region AA.

Referring to FIG. 2 and FIG. 4, in this embodiment, the array substrate further includes scan lines SL, the scan lines SL are extended in a transverse direction, and the scan lines SL and the data lines DL cross each other to define a plurality of pixel units PX in the display region AA, in each of the pixel units PX is provide with a first thin film transistor T1, a second thin film transistor T2, an organic light emitting diode S and a capacitor C, the first thin film transistor T1 is located at the intersection of the scan line SL and the data line DL, the gate electrode of the first thin film transistor T1 is electrically connected to the scan line SL, the input terminal of the first thin film transistor T1 is electrically connected to the data lines DL, the output terminal of the first thin film transistor T1 is electrically connected to the gate electrode of the second thin film transistor T2 and one end of the capacitor C, the input terminal of the second thin film transistor T2 and the other end of the capacitor C are electrically connected to the high level line VL, the output terminal of the second thin film transistor T2 is electrically connected to the anode or the cathode of the organic light emitting diode D, the cathode or the anode of the organic light emitting diode D is electrically connected to ground or low level line.

Further, in this embodiment, the gate electrodes of the thin film transistors are located in the same metal layer, the input and output terminals of the thin film transistors are located in the same metal layer, the data lines DL and the gate electrodes of the thin film transistors are located at the same level, the high level lines VL and input terminal, an output terminal of the thin film transistor at the same layer. Further, in other embodiments of this disclosure, the high level lines and the gate electrodes of the thin film transistors are located at the same layer, the input and output terminals of the thin film transistors are located at the same layer.

Second Embodiment

Figure 5:
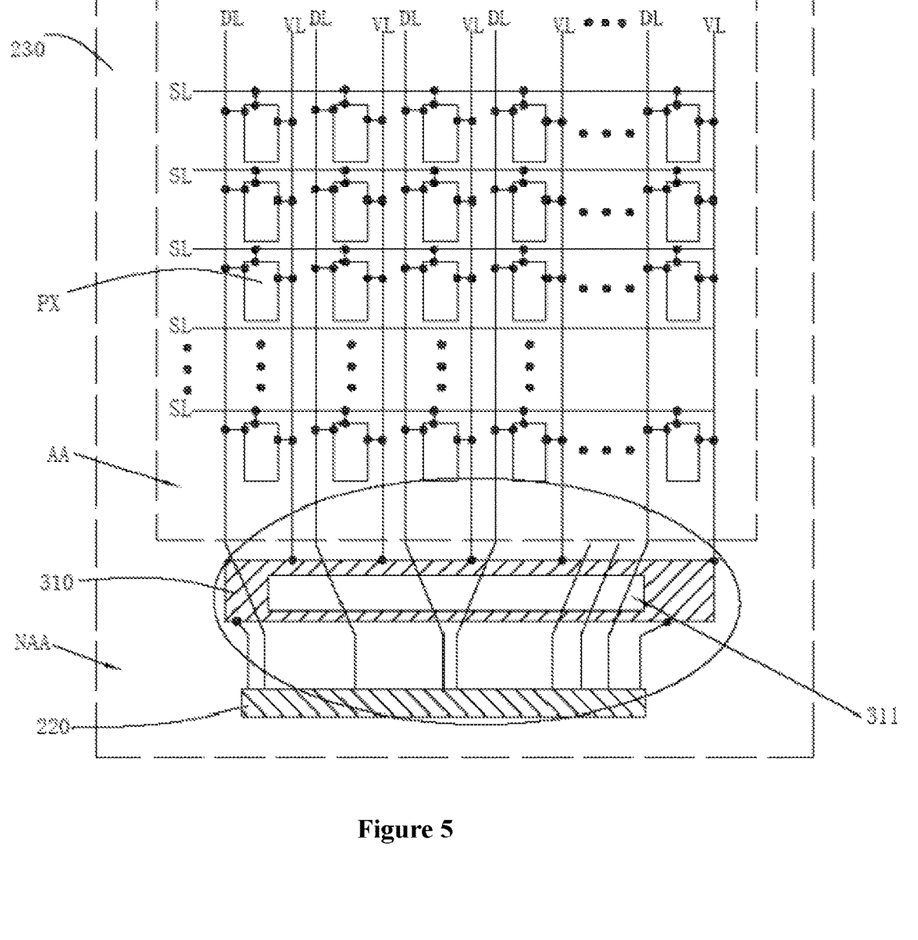
FIG. 5 is a schematic view of an array substrate of a second embodiment of this disclosure.

FIG. 5 shows an array substrate provided by the second embodiment of this disclosure, the structure of FIG. 5 is similar with the one of FIG. 2, so that the same symbol stands for the same component, the main difference between this embodiment and the first embodiment is the metal block.

Figure 6:
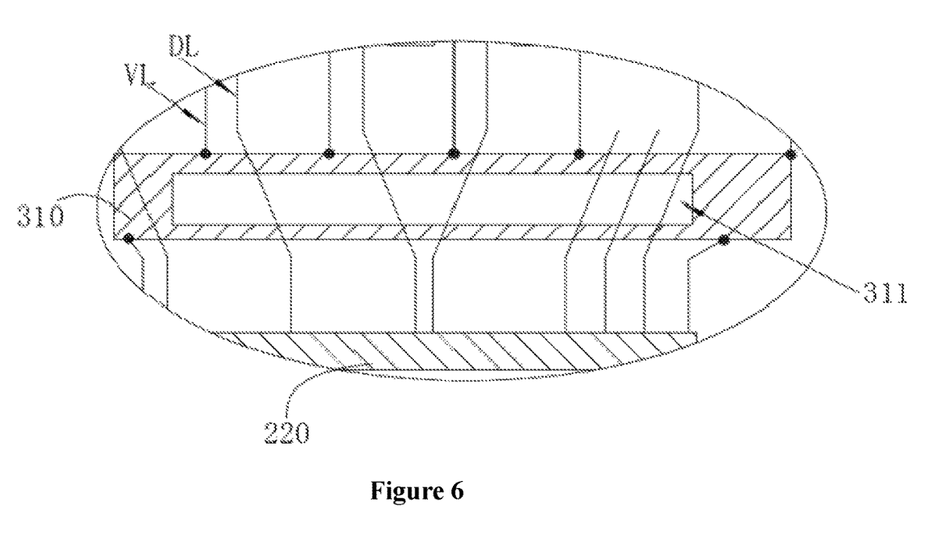
FIG. 6 is an enlarged view of an elliptical area in FIG. 5.

Referring to FIGS. 5 and 6, in this embodiment, the hollowed area is a large opening 311, the opening 311 crosses at least two of the data lines DL, for example, the opening 311 crosses two of the data lines DL, three of the data lines DL, four of the data lines DL, five of the data lines DL, six of the data lines DL, ten of the data lines DL, twenty of the data lines DL, thirty of the data lines DL, or crosses all of the data lines DL. Specifically, in this embodiment, the opening 311 is rectangular, the rectangular opening 311 is extended from the left side to the right side of the metal block 310, and is extended from the upper side to the lower side of the metal block 310, ratio range of the surface area of the opening 311 and the surface area of the metal block without opening 311 is 3/4-1/6, for example, the ratio may be 3/4, 2/3, 1/2, 1/3, 1/4, 1/5, 1/6. The opening 311 can be disposed in the middle of the opening 311, namely the middle of the metal block 310 is hollowed out, and the round of the metal block 310 is connected to each other. In addition, in other embodiments of this disclosure, the opening can also be an open, the open is preferred to be designed towards the driver chip.

the hollowed area of the present embodiment is the opening 311, the opening 311 is disposed across at least two of the data lines DL, so that the opening 311 can reduce the parasitic capacitance, and can greatly reduce the accumulation of static electricity, and greatly reduce the probability of component damage caused by the electrostatic discharge in the metal block 310.

It should be noted that embodiments of the present description all are described in a progressive manner, each embodiment focuses on differences from other embodiments, and reference may be made between embodiments for identical or similar portions.

Regarding an apparatus embodiment, since it is substantially similar to the method embodiment, it is described relatively simply and reference may be made to partial depictions of the method embodiment for relevant portions.

By the above described embodiments, this disclosure has the following advantages:

Since the data lines are electrically connected to driver chip through the area which the metal block is located in, and a insulating layer exists between the metal block and the data lines, a hollow area located in the metal block overlapping the data lines to reduce parasitic capacitance formed by the metal block and the data lines. Thus, by providing the hollowed area, the overlapping area of the data lines and the metal block is reduced, thereby the parasitic capacitance can be reduced, so that this embodiment relative to the prior art can reduce the impact to the signal transfer of data online; moreover, since the region has a hollowed area provided on the metal block, the surface area of the metal block has been reduced, the static electricity is not easy to be accumulated during the manufacturing process, so that the component damage of the AMOLED display device caused by the electrostatic discharge on the metal block can be reduced.

Disclosed above is only one preferred embodiment of the present disclosure, which does not impose undue constraints to the scope of protection of the present disclosure, therefore the equivalent changes made according to the claims of this disclosure are still within the scope of the present disclosure.

What is claimed is:

1. An array substrate, comprising:
a substrate;
a driver chip, located on the substrate;
a plurality of data lines, arranged in turn on the substrate and extended longitudinally to be connected electrically to the driver chip;
a plurality of high level lines, arranged in turn on the substrate, and extending longitudinally on the substrate;
a metal block, located on the substrate and electrically connected to the high level lines, so that the high level lines are at the same high level; wherein the data lines are electrically connected to the driver chip through the area which the metal block is located in, and an insulating layer exists between the metal block and the data lines, a hollow area located in the metal block overlapping the data lines to reduce parasitic capacitance formed by the metal block and the data lines, wherein the hollowed area is a plurality of derating slits, the number of the derating slits is multiple, and at least one of the data lines corresponds to at least one of the derating slits one to one,
wherein de-electrostatic slits are provided in the metal block, the de-electrostatic slits are not overlapping the data lines and are surrounded by the metal block.

2. The array substrate according to claim 1, wherein the derating slits comprise first type derating slits and second type derating slits, one of the data lines corresponds to one of the first type derating slits, at least two of the second type derating slits correspond to a same data line.

3. The array substrate according to claim 2, wherein width of the derating slit is greater than or equal to width of the corresponding data line, the derating slit covers the corresponding data line.

4. The array substrate according to claim 1, wherein the hollowed area is an opening, the opening crosses at least two of the data lines and is surrounded by the metal block.

5. The array substrate according to claim 4, wherein ratio range of surface area of the hollowed area and surface area of the metal block without a hollowed area is 3/4-1/6.

6. The array substrate according to claim 1, wherein the data lines are extended from upper side of the substrate to lower side of the substrate, the data lines comprise a vertical portion, a sector portion and a connecting portion, and the metal block overlaps the sector portion of the data lines.

7. The array substrate according to claim 1 further comprising a plurality of scan lines, wherein the scan lines are extended in a transverse direction, and the scan lines and the data lines cross each other to define a plurality of pixel units, in each of the pixel units is provided with a first thin film transistor, a second thin film transistor, an organic light emitting diode and a capacitor, the first thin film transistor is located in intersection of the scan lines and the data lines, a gate electrode of the first thin film transistor is electrically connected to the scan line, an input terminal of the first thin film transistor is electrically connected to of the data line, an output terminal of the first thin film transistor is electrically connected to a gate electrode of the second thin film transistor and one end of the capacitor, an input terminal of the second thin film transistor and an other end of the capacitor are electrically connected to the high level line, the output terminal of the second thin film transistor is electrically connected to an anode or a cathode of the organic light emitting diode.

8. An AMOLED display device, comprising the array substrate according to claim 1.

9. The array substrate according to claim 2, wherein the data lines are extended from upper side of the substrate to lower side of the substrate, the data lines comprise a vertical portion, a sector portion and a connecting portion, and the metal block overlaps the sector portion of the data lines.

10. The array substrate according to claim 3, wherein the data lines are extended from upper side of the substrate to lower side of the substrate, the data lines comprise a vertical portion, a sector portion and a connecting portion, and the metal block overlaps the sector portion of the data lines.

11. The array substrate according to claim 4, wherein the data lines are extended from upper side of the substrate to lower side of the substrate, the data lines comprise a vertical portion, a sector portion and a connecting portion, and the metal block overlaps the sector portion of the data lines.

12. The array substrate according to claim 2 further comprising a plurality of scan lines, wherein the scan lines are extended in a transverse direction, and the scan lines and the data lines cross each other to define a plurality of pixel units, in each of the pixel units is provided with a first thin film transistor, a second thin film transistor, an organic light emitting diode and a capacitor, the first thin film transistor is located in intersection of the scan lines and the data lines, a gate electrode of the first thin film transistor is electrically connected to the scan line, an input terminal of the first thin film transistor is electrically connected to of the data line, an output terminal of the first thin film transistor is electrically connected to a gate electrode of the second thin film transistor and one end of the capacitor, an input terminal of the second thin film transistor and an other end of the capacitor are electrically connected to the high level line, the output terminal of the second thin film transistor is electrically connected to an anode or a cathode of the organic light emitting diode.

13. The array substrate according to claim 3 further comprising a plurality of scan lines, wherein the scan lines are extended in a transverse direction, and the scan lines and the data lines cross each other to define a plurality of pixel units, in each of the pixel units is provided with a first thin film transistor, a second thin film transistor, an organic light emitting diode and a capacitor, the first thin film transistor is located in intersection of the scan lines and the data lines, a gate electrode of the first thin film transistor is electrically connected to the scan line, an input terminal of the first thin film transistor is electrically connected to of the data line, an output terminal of the first thin film transistor is electrically connected to a gate electrode of the second thin film transistor and one end of the capacitor, an input terminal of the second thin film transistor and an other end of the capacitor are electrically connected to the high level line, the output terminal of the second thin film transistor is electrically connected to an anode or a cathode of the organic light emitting diode.

14. The array substrate according to claim 4, further comprising a plurality of scan lines, wherein the scan lines are extended in a transverse direction, and the scan lines and the data lines cross each other to define a plurality of pixel units, in each of the pixel units is provided with a first thin film transistor, a second thin film transistor, an organic light emitting diode and a capacitor, the first thin film transistor is located in intersection of the scan lines and the data lines, a gate electrode of the first thin film transistor is electrically connected to the scan line, an input terminal of the first thin film transistor is electrically connected to of the data line, an output terminal of the first thin film transistor is electrically connected to a gate electrode of the second thin film transistor and one end of the capacitor, an input terminal of the second thin film transistor and an other end of the capacitor are electrically connected to the high level line, the output terminal of the second thin film transistor is electrically connected to an anode or a cathode of the organic light emitting diode.

* * * * *